United States Patent [19]

Sander et al.

[11] 4,248,957

[45] Feb. 3, 1981

[54] ACID DEGRADABLE RADIATION-SENSITIVE MIXTURE

[75] Inventors: Jürgen Sander, Kelkheim; Detlef Skaletz, Mainz; Gerhard Buhr, Königstein; Gerhard Lohaus, Kelkheim, all of Fed. Rep. of Germany

[73] Assignee: Hoechst Aktiengesellschaft, Fed. Rep. of Germany

[21] Appl. No.: 54,808

[22] Filed: Jul. 5, 1979

[30] Foreign Application Priority Data

Jul. 5, 1978 [DE] Fed. Rep. of Germany ....... 2829511

[51] Int. Cl.³ .................. G03C 1/68; G03C 5/00
[52] U.S. Cl. ................... 430/270; 204/159.24; 204/158 R; 430/281; 430/286; 430/306; 430/329
[58] Field of Search ............. 430/270, 329, 281, 286, 430/306; 204/159.22, 158 R

[56] References Cited

U.S. PATENT DOCUMENTS

| | | | |
|---|---|---|---|
| 2,891,712 | 6/1959 | Plambeck | 430/270 |
| 3,779,778 | 12/1973 | Smith et al. | 96/115 R |
| 3,915,704 | 10/1975 | Limburg et al. | 430/270 |
| 3,915,706 | 10/1975 | Limburg et al. | 430/270 |
| 3,917,483 | 11/1975 | Limburg et al. | 430/270 |
| 3,932,514 | 1/1976 | Thelen et al. | 252/466 PT |

*Primary Examiner*—Jack P. Brammer
*Attorney, Agent, or Firm*—James E. Bryan

[57] ABSTRACT

This invention relates to an improvement in a radiation-sensitive mixture containing (a) a compound which forms an acid under the influence of actinic radiation and (b) a compound which has at least one acid-cleavable C—O—C group and the solubility of which in a liquid developer is increased by the action of an acid, the improvement that the compound which is capable of being cleft by an acid contains at least one enol ether group as the acid-cleavable group. The invention also relates to a process for producing relief images using the radiation-sensitive mixture.

8 Claims, No Drawings

ACID DEGRADABLE RADIATION-SENSITIVE MIXTURE

This invention relates to a novel radiation-sensitive mixture which contains as substantial constituents (a) a compound forming an acid under the influence of actinic radiation and (b) a compound having at least one C—O—C group which is capable of being cleft by an acid.

Positive-working light-sensitive copying materials are known, i.e. materials the copying layers of which become soluble in the exposed areas. The positive-working copying materials based on o-quinone diazides have, above all, gained acceptance in practice.

The light-sensitivity of these copying materials is often not satisfactory. To enhance the light-sensitivity, catalytically active light-sensitive systems may be employed, because, then, the quantum efficiency will become greater than 1.0. Recently, the well-known principle of starting subsidiary reactions by photolytically produced acids and thereby rendering soluble the exposed areas has been put to use in positive-working systems. In this process, photochemically produced strong acids serve to split special low and high-molecular weight acetals and O,N-acetals containing aromatic compounds as hydroxyl or amine components (U.S. Pat. No. 3,779,778) and orthoesters and amideacetals (German Offenlegungsschrift No. 2,610,842).

Combinations of photochemical acid formers with particular polyaldehydes and polyketones also have been described as positive-working copying compositions which produce visible images upon exposure (U.S. Pat. Nos. 3,915,704, 3,915,706, 3,917,483, 3,923,514, and 2,892,712).

These mixtures of substances are, however, not without disadvantages. The properties of polyaldehydes and polyketones which, as the essential constituents, determine the quality of the corresponding recording materials can to only a limited extent be varied and adapted to practical requirements.

In spite of their catalytical mode of acting, the copying compositions containing the above-mentioned acetals and O,N-acetals do not have a satisfactory practical light-sensitivity. In addition, many of the acetals, O,N-acetals and orthoesters mentioned are not easily obtainable.

Further, a likewise positive-acting radiation-sensitive mixture composed of photolytic acid donors and particular aliphatic polyacetals has been described in the previous German Patent Application No. P 27 18 254.

It is an object of the invention to provide a novel positive-working radiation-sensitive mixture which is highly sensitive to actinic radiation, in particular to short-wave light and electronic radiation, and the constituents of which may be easily obtained.

The invention is based on a radiation-sensitive mixture which contains (a) a compound forming an acid under the influence of actinic radiation and (b) a compound which has at least one acid-cleavable C—O—C group and the solubility of which in a liquid developer is increased by the action of an acid.

The mixture of the invention has the feature that the compound which is capable of being cleft by an acid contains as the acid-cleavable group at least one enol ether group.

In the present description, actinic radiation is to be understood as meaning any radiation having an energy which corresponds at least to the energy of short-wave visible light. Long-wave UV radiation is particularly suitable, and also electronic and laser radiation.

Suitable liquid developers are, in particular, aqueous solutions, preferably weakly alkaline solutions, and also organic solvents which may be mixed with water or aqueous solutions.

The preferred compounds which are capable of being cleft by an acid and contain at least one enol ether group are those which correspond to the general formula I:

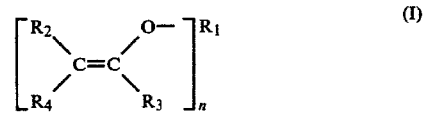

wherein $R_1$ is an n-valent aliphatic group which may be substituted and has at least 2 carbon atoms, $R_2$, $R_3$ and $R_4$ are identical or different and are hydrogen atoms, alkyl or aryl groups, or any two thereof are linked to form a saturated or olefinically unsaturated ring which may be substituted, and n is an integer from 1 to 4, preferably 1 or 2, in particular 2.

Aryl groups are to be understood as meaning preferably mononuclear or polynuclear aromatic or heteroaromatic groups which may be substituted by alkyl, aryl, alkoxy, aryloxy, acyl, acyloxy, alkylmercapto, aminoacyl, acylamino, carbalkoxy, nitro, sulfonyl or cyano groups or by halogen atoms, and which generally contain from 4 to 20 carbon atoms. Mononuclear aromatic groups containing from 6 to 10 carbon atoms are preferred.

If $R_2$, $R_3$, or $R_4$ represent alkyl groups, the latter may be saturated or unsaturated, open-chain or cyclic and may be substituted by halogen atoms, cyano, ester, hydroxy, alkoxy, aryloxy or aryl groups.

As individual substituents $R_2$, $R_3$, and $R_4$ have usually from 1 to 15, preferably from 1 to 8 carbon atoms.

If two of the groups $R_2$, $R_3$, and $R_4$ together form a cycloalkyl or cycloalkenyl group, the latter usually may have from 3 to 8, preferably 5 or 6 ring members. Compounds of this type are also preferred in which this ring is linked by annellation with an aromatic or cycloaliphatic ring. The ring system may be substituted by groups of the above-specified type. It may generally contain from 4 to 20, preferably from 5 to 15 carbon atoms.

In addition to the specified substituents, another grouping of the formula I may be present as a substituent in one of the groups $R_2$, $R_3$, and $R_4$.

Suitable n-valent aliphatic groups $R_1$ are branched and unbranched, saturated and unsaturated, cyclic and open-chain groups which may be substituted by possibly substituted aryl groups, halogen atoms, cyano, ester, aryloxy, hydroxyl or alkoxy groups and may contain ether, thioether or keto groups. $R_1$ has usually from 2 to 30, preferably from 2 to 15 carbon atoms. If n=1, $R_1$ preferably should have at least 6 carbon atoms.

A particular group of compounds of the general formula I are compounds which have the formula II:

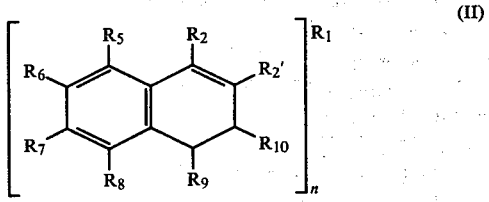

In this formula, $R_1$ and n have the same meaning as in formula I.

$R_2$ and $R_2'$ differ from each other, one of the groups representing the —O— group and the other a hydrogen atom, an alkyl or an aryl group, and $R_5$ to $R_{10}$ are identical or different and represent hydrogen atoms or halogen atoms, alkyl, aryl or alkoxy groups.

The acid-cleavable compounds generally may be obtained by reacting n moles of a carbonyl compound (ketone or aldehyde), having the formula

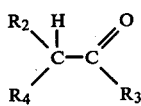

or n moles of the enol ethers derived from these carbonyl compounds, having the formula

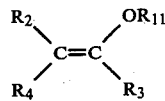

with 1 mole of an alcohol of the formula $R_1(OH)_n$. n and $R_1$ to $R_4$ have the above-specified meaning; $R_{11}$ is an alkyl group containing from 1 to 6 carbon atoms, in particular a methyl or ethyl group.

The conversion of the above-mentioned carbonyl compounds into the enol ethers of the above formula, which must be regarded as being the synthetic equivalents of these carbonyl compounds, may be easily achieved according to known methods, for example, by reaction with orthocarboxylic acid esters.

In this description, n-valent aliphatic alcohols are to be understood as meaning alcohols, the alcoholic OH groups of which are all grouped at different saturated aliphatic or cycloaliphatic carbon atoms.

Carbonyl compounds from which or from the lower enol monoalkylethers of which the acid-cleavable enol ethers of the formula 1 may be prepared as, for example: 1 and 2-tetralone, 1 benzosuberone, chromanone-4, thiochromanone-4, 2,2-dimethylthiochromanone-4, 2-methyl-thiochromanone-4, 1-methyl-2-, 2-methyl-1-, 4-methyl-1-, 5-methoxy-1-, 5-methoxy-2-, 6-methoxy-2-, 6-methoxy-1-, 7-methoxy-1-, 7-methoxy-2- and 4-phenyl-1-tetralone, 4,5,6,7-tetrahydro-4-oxo-thionaphthene, 4,5,6,7-tetrahydro-4-oxobenzofuran and 6-methyl or 6,6-dimethyl-4,5,6,7-tetrahydro-4-oxobenzofuran, n-pentanal, 2 and 3-methyl-pentanal, 9-fluorenealdehyde, phenyl and diphenylacetaldehyde, phenoxyacetaldehyde, 2-phenyl and 3-phenylpropionaldehyde, n-hexanal, 2 and 3-ethylbutanal, 4-methylpentanal, cyclopentanecarbaldehyde, n-heptanal, cyclohexane carbaldehyde, 1,2,3,6-tetrahydro-benzaldehyde, 3-ethylpentanal, 3 and 4-methyl-hexanal, n-octanal, 2 and 4-ethylhexanal, 3,5,5-trimethyl-hexanal, 4-methyl-heptanal, 3-ethyl-n-heptanal, decanal, the monohydroformylation product of dicyclopentadiene, dodecanal, phenylacetone, 1,3-diphenylacetone, 2,2-diphenyl-acetone, benzyl-acetone, butane-2-one, benzylpropylketone, ethylbenzylketone, benzylmethylketone, 5-methyl-hexane-2-one, 2-methyl-pentane-2-one, 2-methyl-pentane-3-one, hexane-2-one, hexane-3-one, pentane-3-one, 2-methyl-butane-3-one, 2,2-dimethyl-butane-3-one, 5-methyl-heptane-3-one, octane-3-one, octane-4-one, octane-2-one, nonane-2-one, nonane-3-one, nonane-5-one, heptane-2-one, heptane-3-one, heptane-4-one, undecane-5-one, undecane-6-one, dodecane-2-one, dodecane-3-one, dinonyl-ketone, undecane-2-one, undecane-2-one, tridecane-2-one, tridecane-3-one, dodecane-5-one, dioctylketone, 2-methyloctane-3-one, decane-2-one, decane-3-one, decane-4-one, methyl-α-naphthylketone, didecylketone, diheptylketone, dihexylketone, 3-fluoro-4-methoxy-acetophenone, acetophenone, 4-chloro-acetophenone, 2,5-dichloro-acetophenone, 4-bromo-acetophenone, 2,4-dimethyl-acetophenone, 2, 3, and 4-fluoro-acetophenone, desoxybenzoin, 2, 3, and 4-methoxy-acetophenone, 2, 3, and 4-methylacetophenone, propiophenone, 2-bromo-propiophenone, 4-fluoropropiophenone, 4-methoxy-propiophenone, butyrophenone, 4-chlorobutyrophenone, valerophenone, cyclohexanone, 2-phenyl-cyclohexanone, 2, 3, and 4-methyl-cyclohexanone, 2,6-dimethylcyclohexanone, and 4-t-butyl-cyclohexanone.

In principle, di-aldehydes and di-ketones or the synthetic equivalents thereof also may be reacted in the same way, whereby compounds having two groupings of the formula I are formed.

Suitable n-valent aliphatic alochols are, for example: benzylalcohol, 4-methoxy-benzylalcohol, ethyleneglycol monobutylether, diethyleneglycol monohexylether, triethyleneglycol monobutylether, 2-phenoxy-phenoxypropanol, 2-ethyl-hexanol, 2-ethylbutanol, 1 and 2-phenyl-ethanol, octanol, decanol, dodecanol, ethyleneglycol monophenylether, ethyleneglycol, propane-1,2-diol, 3-chloro-propane-1,2-diol, propane-1,3-diol, n-butane-1,3-diol, n-butane-2,3-diol, 2-methyl-n-pentane-2,4-diol, 2,3-dimethyl-n-butane-2,3-diol, 3-methyl-pentane-2,4-diol, 2-ethyl-hexane-1,3-diol, cyclohexane-1,3-diol, cyclohexane-1,2-diol, 2-phenoxypropane-1,3-diol, 2-butoxyethylpropane-1,3-diol, 2,2-dimethylpropane-1,3-diol, 2,2-diethylpropane-1,3-diol, 2-ethyl-2-butylpropane-1,3-diol, butane-1,4-diol, 7-phenyl-heptane-1,4-diol, n-hexane-2,5-diol, octane-2,5-diol, nonane-3,6-diol, pentane-1,5-diol, n-hexane-1,6-diol, 2-ethyl-hexane-1,6-diol, 2,3-dimethylhexane-1,6-diol, heptane-1,7-diol, cyclohexane-1,4-diol, nonane-1,7-diol, nonane-1,9-diol, 3,6-dimethyl-nonane-1,9-diol, decane-1,10-diol, dodecane-1,12-diol, 1,4-bis-(hydroxymethyl)-cyclohexane, 2-ethyl-1,4-bis-(hydroxymethyl)-cyclohexane, 2-methyl-cyclohexane-1,4-diethanol, 2-methyl-cyclohexane-1,4-dipropanol, thiodipropyleneglycol, 3-methyl-pentane-1,5-diol, dibutyleneglycol, hydroxypivalic acid-neopentylglycolester, 4,8-bis-(hydroxymethyl)-tricyclodecane, n-butene-(2)-1,4-diol, n-but-2-ine-1,4-diol, n-hex-3-ine-2,5-diol, 1,4-bis-(2-hydroxy-ethoxy)-butine-(2), p-xylyleneglycol, 2,5-dimethyl-hex-3-ine-2,5-diol, bis-(2-hydroxyethyl)-sulfide, 2,2,4,4-tetramethylcyclobutane-1,3-diol, di, tri, tetra, penta and hexaethyleneglycol, di and tripropyleneglycol, polyethyleneglycols having average molecular weights of 200, 300, 400 and 600, glycerol, butane-1,2,4-triol, pentane-1,2,5-triol, pentane-1,3,5-triol, hexane-1,2,6-triol, 1,4,7-trihydroxy-heptane, 2,2,5,5-tetramethylolcyclopentanone, and 2,2,6,6-tetramethylolcyclohexanone.

The above-described preferred organic compounds of the general formula I normally may be prepared in a single-stage process by reacting ketones or aldehydes or the synthetic equivalents thereof, in the presence of acid catalysts, for example, p-toluene sulfonic acid, sulfuric acid and acid ion exchangers, with aliphatic alcohols.

The ketones and aldehydes and also the aliphatic alcohols are commercially available, or they may be easily obtained by known processes.

By using different enol ethers or mixtures thereof, the material properties of the recording materials may be varied within wide ranges.

The enol ethers employed may contain one or several enol ether groups, depending upon the valence of the alcohol or depending upon the number of carbonyl groups in the basic carbonyl compound.

The enol ethers of the formula I generally have molecular weights ranging from about 250 to 800. A good resistance to the developers of the unexposed areas is usually obtained if enol ethers having molecular weights ranging from 300 to 600 are used.

The herein described method for preparing enol ethers of the general formula I is a particularly easily realizable method.

Compounds of the general formula II may, for example, also be prepared by an electrochemical reduction of 2-naphthyl ethers, for example, as described in German Offenlegungsschrift No. 2,618,276.

To prepare the positive-working radiation-sensitive mixtures of the invention, the above-described enol ethers are mixed with substances which form acids, photochemically and/or by the action of high-energy rays. The proportion of the enol ethers in the non-volatile constituents of the entire mixture may range between about 9 and 70% by weight, preferably between 14 and 45% by weight.

In addition, the mixtures preferably contain a polymeric, particularly water-insoluble binder which is soluble in organic solvents. As developing liquids for the exposed copying layers, aqueous alkaline solutions advantageously may be used, and they are usually preferred to developers based on organic solvents; therefore, the preferred binders are especially those which are soluble or at least swellable in aqueous alkaline solutions.

The phenolic resins, in particular the novolaks, which have been successfully used in many positive-working copying materials also have proved to be especially useful and advantageous in the mixtures according to the invention. They promote the strong differentiation between the exposed and unexposed layer areas upon development, particularly the more highly condensed resins containing substituted phenols, e.g. cresols, as condensation partners of formaldehyde. The novolaks also may be modified in known manner, by reacting part of their hydroxy groups, for example, with chloroacetic acid, isocyanates, epoxides or carboxylic acid anhydrides. Other alkali-soluble resins, for example copolymers of maleic anhydride and styrene, vinyl acetate and crotonic acid, methylmethacrylate and methacrylic acid and the like, are also suitable as binders. The type and quantity of the alkali-soluble resins may vary according to the intended use. The preferred proportions relative to the total solids content range between 30 and 90% by weight, particularly preferred between 55 and 85% by weight. In addition, a large number of other resins may be used as well, preferred are vinyl polymers, such as polyvinyl acetates, polyacrylates, polyvinyl ethers and polyvinyl pyrrolidones which, in turn, may be modified by comonomers. The most favorable proportions of these resins depend upon the technical requirements and upon their influence on the developing conditions and, generally, they do not exceed 20% of the alkali-soluble resin. To meet special requirements regarding, for example, flexibility, adhesion, gloss, etc., the light-sensitive layer additionally may contain small quantities of other substances, for example, polyglycols, cellulose derivatives, such as ethyl cellulose, wetting agents, dyes and finely divided pigments.

A large number of known compounds and mixtures are suitable as radiation-sensitive components which form or split-off acids upon radiation; among these are, for example, diazonium, phosphonium, sulfonium and iodonium salts, halogen compounds, quinone diazide sulfochlorides, and organometal-organohalogen combinations.

Suitable diazonium salts are the compounds known in diazo printing which have a utilizable absorption between 300 and 600 nm. Some proven diazonium compounds which have a sufficient storability, as is known from experience, are given in the examples; compounds which do not contain any basic substituents are preferred.

The diazonium, phosphonium, sulfonium and iodonium compounds mentioned are, as a rule, employed in the form of their salts which are soluble in organic solvents, in most cases as separation products with complex acids, such as hydrofluoboric acid, hexafluorophosphoric acid, hexafluoroantimonic acid and hexafluoroarsenic acid.

It is, however, also possible to use derivatives of the positive-working o-quinone diazides. The acidity of the indenecarboxylic acids formed when exposing o-naphthoquinone diazides is, in most cases, only just sufficient for an adequate imagewise differentiation. From this group, the naphthoquinone-1,2-diazide-4-sulfochloride is preferred, during the exposure of which three acid functions are formed, so that a relatively high amplification factor is produced upon cleavage of the enol ethers.

In principle, any organic halogen compounds which are also known as photochemical free-radical initiators, for example, compounds having more than one halogen atom on one carbon atom or on one aromatic ring, may be used as halogen-containing radiation-sensitive compounds which form halogen hydracid. Examples thereof are described in U.S. Pat. Nos. 3,515,552, 3,536,489, and 3,779,778, and in German Offenlegungsschrift No. 2,243,621. Also in the case of the positive-working copying layers of the invention, the action of these halogen-containing compounds may be spectrally influenced and enhanced by known sensitizers.

Also suitable are particular substituted trichloromethyl pyrones, such as described in German Offenlegundsschrift No. 2,610,842. The 2-aryl-4,6-bis-trichloromethyl-s-triazines described in the previous German patent application No. P. 27 18 259 are particularly suitable.

Examples of suitable initiators are:

4-(di-n-propylamino)-benzene diazonium tetrafluoroborate, 4-p-tolylmercapto-2,5-diethoxy-benzene diazonium hexafluorophosphate and diazonium tetrafluoroborate, diphenylamine-4-diazonium sulfate, 4-methyl-6-trichloromethyl-2-pyrone, 4-(3,4,5-trimethoxystyryl)-6- trichloromethyl-2-pyrone, 4-(4-methoxy-styryl)-6-(3,3,3-trichloropropenyl)-2-pyrone, 2-trichloromethyl-benzimidazole, 2-tribromomethyl-quinoline, 2,4-dimethyl-1-tribromoacetyl-benzene, 3-nitro-1-tribromoacetyl-benzene, 4-dibromoacetyl-benzoic acid, 1,4-bis-dibromo-methyl-benzene, tris-dibromomethyl-s-triazine, 2-(6-methoxy-naphth-2-yl)-, 2-(naphth-1-yl)-, 2-(naphth-2-yl)-, 2-(4-ethoxy-ethyl-naphth-1-yl)-, 2-(benzopyran-3-yl)-, 2-(4-methoxyanthrac-1-yl)-, 2-(phenanthr-9-yl)-4,6-bis-trichloromethyl-s-triazine and the compounds mentioned in the examples.

The amount of initiator used also may vary widely depending upon its chemical nature and upon the composition of the mixture. Favorable results are obtained, if about 0.1 to 10% by weight relative to the total solids content are employed, 0.2 to 5% being preferred. For copying layers having thicknesses exceeding 10 μm it is, in particular, advisable to use relatively small amounts of acid donors.

In addition, soluble or finely divided dispersible dyes and, depending upon the purpose for which it is intended, UV absorbers may be added to the light-sensitive mixture. The most favorable quantitative relationships between the components may be easily determined in each individual case with the aid of preliminary tests.

Suitable solvents for the mixture of the invention are ketones, e.g. methylethyl ketone; chlorinated hydrocarbons, e.g. trichloroethylene and 1,1,1-trichloroethane; alcohols, e.g. n-propanol; ethers, e.g. tetrahydrofuran; alcohol ethers, e.g. ethylene glycol monoethyl ether; and esters, e.g. butyl acetate. Mixtures which, for special purposes, additionally may contain solvents, for example, acetonitrile, dioxane or dimethyl formamide, also may be employed. Basically, any solvents may be used which do not irreversibly react with the components of the layer.

The intended coating process, the thickness of the layer and the drying apparatus employed must, however, be taken into account when choosing the solvents. Thin layers of up to about 5 μm in experimental amounts are preferably applied on a whirler coater by pouring on the solution. By one application according to this procedure or by means of a doctor blade, layer thicknesses exceeding 60 μm may be obtained, if solutions having solids contents of up to about 40% are used. If the coating is to be applied to both sides of the support, dip-coating is preferred; in that case, the use of low-boiling solvents will yield the advantage of a fast-drying coating. Webs are coated by means of rollers, slot dies or by spraying. Individual plates, for example, zinc and multimetal plates may be coated with the aid of a curtain coater.

As compared with other positive-working layers, in particular the layers based on o-naphthoquinone diazide, thicker layers advantageously may be prepared using the light-sensitive mixture of the invention, because the light-sensitivity of this mixture is only to a relatively small extent dependent upon the thickness of the layer. It is possible to expose and process layers having thicknesses of up to about, and even exceeding, 100 μm.

Preferred supports for thick layers exceeding 10 μm are plastic films which, then serve as temporary supports for transfer layers. For that purpose and for color films, polyester films, for example, made of polyethylene terephthalate, are preferred. Polyolefin films, e.g., of polypropylene, are, however, also suitable. The supports for layers having thicknesses below about 10 μm are usually metals. The following materials may be employed as supports for offset printing plates: mechanically or electrochemically roughened and, if required, anodized aluminum which may, additionally, have been subjected to a chemical pretreatment using, e.g., polyvinyl phosphonic acid, silicates or phosphates; also multimetal plates having Cu/Cr or brass/Cr as the uppermost layer. For the preparation of letterpress printing plates, the layers of the invention may be applied to zinc or magnesium plates or the commercial microcrystalline alloys thereof for powderless etching processes; in addition, the layers may be applied to etchable plastic materials, for example, polyoxymethylene. Due to their good adhesion and resistance to etching on copper and nickel surfaces, the layers of the invention are suitable for the preparation of gravure printing or screen printing forms. The inventive mixtures also may be used as photoresists in chemical milling.

Further, the coating may be applied directly or by layer transfer from a temporary support to materials for printed circuit boards comprising insulating plates which have a copper plating on one or on both sides; to glass or ceramic materials which may have been subjected to an adhesion-promoting pretreatment, and to silicon discs for which, in the field of microelectronics, experience has already been gained in electron-beam imaging. In addition, wood, textiles and the surfaces of many other materials may be coated, which are advantageously imaged by projection and are resistant to the action of alkaline developers.

For drying after coating, the conventional apparatuses and conditions may be adopted. The layers withstand temperatures up to about 100° C., and for short periods also up to 120° C., without any loss of radiation sensitivity.

The usual light sources may be employed for exposure, for example, tubular lamps, xenon pulse lamps, metal halide high pressure mercury vapor lamps and carbon arc lamps. In addition, the light-sensitive enol ether layers may be exposed in the conventional projectors and enlarged under the light of the metal filament lamps and by contact exposure with ordinary incandescent bulbs. The coherent light of a laser also may be used for exposure. For the purposes of the present invention, short-wave lasers of an adequate power are suitable, for example, argon lasers, krypton ion lasers, dyestuff lasers and helium-cadmium lasers emitting radiation between 300 and 600 mm. The laser beam is controlled by means of a predetermined programmed line and/or halftone screen pattern.

Another possibility of imaging consists in irradiating with electron beams. Electron beams can thoroughly disintegrate and crosslink the mixture of the invention as well as many other organic materials, so that a negative image is formed when the non-irradiated areas are removed by solvents or by exposing without an original and developing. In case of a lower intensity and/or higher writing speed of the electron beam, on the other hand, the electron beam causes a differentiation which results in an increased solubility, i.e. the irradiated layer areas may be removed by the developer. It has been found that the layers according to the invention have a considerably higher sensitivity to electron beam irradiation than conventional naphthoquinone diazide layers and—as explained in the examples—that a wide range of a comparatively low energy action from electron beams may be utilized. The most favorable conditions may be easily determined by preliminary tests.

The imagewise exposed or irradiated layer may be removed by practically the same developers which are also used for commercial naphthoquinone diazide layers and photoresist compositions; or the copying conditions for the novel layers advantageously may be adapted to the known auxiliaries, e.g., developers and programmed spray developing apparatuses. The aqueous developing solutions may, for example, contain alkali phosphates, alkali silicates or alkali hydroxides and, in addition, wetting agents and small amounts of organic solvents. In certain cases, solvent/water mixtures also may be used as developers. The most favorable developer may be determined by carrying out tests with the layer used in each particular case. If necessary, the developing process may be promoted by mechanical means. In order to increase the stability during printing and also the resistance to washing solutions, correcting agents and printing inks which are hardenable by UV light, the developed plates may, for a short period, be heated to elevated temperatures, as has been proposed for diazo layers in British Pat. No. 1,154,749.

According to the invention, a process is also proposed for producing relief images, in which a radiation-sensitive recording material which comprises a support and a recording layer containing as substantial constituents (a) a compound forming an acid under the influence of actinic radiation and (b) a compound which has at least one acid-cleavable C—O—C group and the solubility of which in a liquid developer is increased by the action of an acid, is imagewise irradiated with actinic radiation of such a dosage that the solubility of the layer in a liquid developer is increased and the irradiated layer areas are then removed with the aid of a developer. The process has the feature that a compound (b) is used which contains as the acid-cleavable group at least one enol ether group.

If electronic radiation is used to carry out the process, the known photolytic acid donors which are sensitive to long-wave ultraviolet and visible light are suitable and, in addition, also photolytic acid donors which have their absorption ranges in the shorter wave region of the electromagnetic spectrum and which are, thus, only slightly sensitive to daylight. This yields the advantage that the recording materials need not be handled in the absence of light and that the materials may be rendered storable in a better way.

Initiators of this kind are, for example, tribromomethylphenyl-sulfone, 2,2',4,4',6,6'-hexabromo-diphenylamine, pentabromoethane, 2,3,4,5-tetrachloroaniline, pentaerythritol-tetrabromide, ®Clophen resin W, i.e. a chlorinated terphenyl resin, or chlorinated paraffins.

Below, examples of the light-sensitive mixtures according to the invention are given. First, the preparation of a number of novel enol ethers is described, which have been tested as aciddegradable compounds in the mixtures according to the invention. They are consecutively numbered as compounds 1 to 36, and are also designated by these numbers in the examples of applications.

In the examples, parts by weight (p.b.w.) and parts by volume (p.b.v.) have the same relationship as the g to the ml. If not otherwise specified, percentages and quantitative relationships are to be understood as being given in units of weight.

General Rule A

Preparation of compounds 1 to 24 listed in Tables 1 to 3

1 mole of an n-valent aliphatic alcohol and n moles of methyl enol ether or ethyl enol ether are stirred for 2 to 3 hours at room temperature or at a slightly elevated temperature, in the presence of 1 to 2% by weight of an acid catalyst, for example, p-toluene sulfonic acid. The methanol or ethanol liberated in the reaction is completely removed under water-jet vacuum. After the addition of an inert solvent and solid sodium carbonate, the reaction mixture is filtered and freed of the solvent. The oil which remains after the removal of readily volatile constituents under high vacuum at 100° to 150° C. has no hydroxyl bands in its IR spectrum. For characterization, the signals of the vinylic protons in the NMR spectrum, the enol ether bands in the IR spectrum and the mole peaks in the mass spectrum are given.

In the same way, many of the compounds listed may be prepared, if the alcohol liberated is distilled off under standard pressure.

Table 1

Compounds of the general formula I
n = 2; $R_2$ = H

| Compound No. | $R_1$ | $R_4$\C=C/$R_3$ (H, O—) | NMR vinyl protons δ (ppm) (CDCl$_3$) | IR (cm$^{-1}$) (CH$_2$Cl$_2$) | MS (M$^+$) | Yield (% of theoretical) |
|---|---|---|---|---|---|---|
| 1 | (—CH$_2$)$_2$—O—(CH$_2$—)$_2$ | (benzofuran-O— structure) | 4.80 | 1 645 | 366 | 51 |
| 2 | (—CH$_2$)$_2$(—OCH$_2$CH$_2$)$_2$— | (benzocycloheptene-O— structure) | 5.14 | 1 630 | 434 | 73 |
| 3 | —(CH$_2$—)$_5$ | as 2 | 5.18 | 1 630 | 388 | 46 |

Table 1-continued

Compounds of the general formula I
n = 2; $R_2$ = H

| Compound No. | $R_1$ | NMR vinyl protons δ (ppm) (CDCl$_3$) | IR (cm$^{-1}$) (CH$_2$Cl$_2$) | MS (M$^+$) | Yield (% of theoretical) |
|---|---|---|---|---|---|
| 4 | $(-CH_2)_2-O-(CH_2-)_2$ | — | 1 630 | 398 | 25 |

Table 2

Compounds of the general formula II - ($R_6 = R_7 = R_8 = R_9 = R_{10}$ = H); $R_2'$ = O—

| Compound No. | n | $R_1$ | $R_2$ | $R_5$ | NMR vinyl protons δ(ppm) (CDCl$_3$) | IR (cm$^{-1}$) (CH$_2$Cl$_2$) | MS (M$^+$) | Yield (% of theoretical) |
|---|---|---|---|---|---|---|---|---|
| 5 | 2 | $(-CH_2)_2(-OCH_2CH_2)_3-$ | H | H | 5.52 | 1 635 | 450 | 48 |
| 6 | 3 | $C_2H_5-C(CH_2-)_3$ | H | H | 5.65 | 1 635 | 518 | 64* |
| 7 | 1 | $(-CH_2)_2-O-(CH_2-)_2O-(CH_2-)_5CH_3$ | H | H | 5.59 | 1 635 | 318 | 75 |
| 8 | 2 | $(-CH_2)_2(-OCH_2CH_2)_2-$ | CH$_3$ | H | — | 1 645 | 434 | 52 |
| 9 | 2 | $(-CH_2)_2(-OCH_2CH_2)_2-$ | H | CH$_3$O | 5.88 | 1 635 | 466 | 74 |
| 10 | 2 | p-xylylene | H | H | 5.63 | 1 635 | 394 | 48 |

In the compounds marked with an asterik(*) cyclic ketals have also been formed.

Table 3

Compounds of the general formula II
($R_2' = R_5 = R_6 = R_7 = R_8 = R_9 = R_{10}$ = H); $R_2$ = O—

| Compound No. | n | $R_1$ | NMR vinyl protons δ(ppm) (CDCl$_3$) | IR (cm$^{-1}$) (CH$_2$CL$_2$) | MS (M$^+$) | Yield (% of th.) |
|---|---|---|---|---|---|---|
| 11 | 2 | $-(CH_2-)_5$ | 4.99 | 1 630 | 360 | 83 |
| 12 | 2 | $-(CH_2-)_4$ | 4.96 | 1 635 | 346 | 34 |
| 13 | 2 | $-(CH_2-)_3$ | 5.00 | 1 635 | 332 | 32* |
| 14 | 2 | $-(CH_2-)_2$ | 4.99 | 1 635 | 318 | 30* |
| 15 | 1 | $(-CH_2)_2(-OCH_2CH_2)_3-C_2H_5$ | 4.96 | 1 635 | 334 | 45 |
| 16 | 1 | phenoxyethyl | 5.02 | 1 635 | 266 | 51 |
| 17 | 1 | $(-CH_2)_{11}-CH_3$ | 4.95 | 1 635 | 314 | 59 |
| 18 | 1 | $(-CH_2)_2(-OCH_2CH_2)_2-$n-C$_4$H$_9$ | 4.96 | 1 635 | 318 | 40 |
| 19 | 2 | $-(CH_2-)_{10}$ | 4.94 | 1 635 | 430 | 84 |
| 20 | 2 | 1,4-dimethyl-cyclohex-7,8-ylene | 4.95 | 1 630 | 400 | 79 |
| 21 | 2 | 1,4-cyclohexylene | 5.05 | 1 630 | 372 | 62 |
| 22 | 2 | 4,8-dimethyl-tricyclo-(4,3,1,0)-dec-11,12-ylene | 4.96 | 1 635 | 452 | 94 |
| 23 | 2 | 2,2-diethyl-1,3-propylene | 5.04 | 1 635 | 388 | 67 |
| 24 | 3 | $-CH_2-CH(-)-(CH_2-)_4$ | 4.94 | 1 635 | 518 | 81* |

In the compounds marked with an asterik(*) cyclic ketals have also been formed.

General Rule B

Preparation of Compounds 25 to 33 listed in Tables 4 and 5

1 mole of an n-valent aliphatic alcohol and n moles of a ketone or aldehyde, in the presence of 1 to 2% by weight of an acid catalyst, e.g., an acid ion exchanger, are refluxed in a solvent which is inert under the conditions of the reaction and forms an azeotropic mixture with water, for example, benzene, toluene, xylene, chloroform, or methylene chloride, until any separation of reaction water has ceased. After neutralizing, e.g., with sodium carbonate, the reaction mixture is filtered and freed of the solvent. The oil which remains after the removal of readily volatile constituents under high vacuum at 100° to 150° C. has no hydroxyl bands and also no carbonyl bands in its IR spectrum, instead, the characteristic enol ether band appears. The NMR spectrum shows the signals given in Table 4, which are characteristic of vinylic protons. For further characterization, the mole peaks in the mass spectrum are given.

Table 4

Compounds of the general formula II
($R_2 = R_5 = R_6 = R_7 = R_8 = R_{10} = H$); $R_2' = O-$

| Compound No. | n | $R_1$ | $R_9$ | NMR vinyl protons $\delta$(ppm) (CDCl$_3$) | IR (cm$^{-1}$) (CH$_2$Cl$_2$) | MS (M$^+$) | Yield (% of th.) |
|---|---|---|---|---|---|---|---|
| 25 | 2 | (—CH$_2$)$_2$—O—(CH$_2$—)$_2$ | phenyl | 5.55 | 1 635 | 514 | 39 |
| 26 | 2 | (—CH$_2$)$_4$— | H | 5.53 | 1 635 | 346 | 47 |
| 27 | 1 | (—CH$_2$)$_7$—CH$_3$ | H | 5.43 | 1 635 | 258 | 45 |
| 28 | 2 | (—CH$_2$)$_3$— | H | 5.50 | 1 635 | 332 | 39 |
| 29 | 2 | (—CH$_2$)$_2$—O—(CH$_2$—)$_2$ | H | 5.50 | 1 635 | 362 | 48 |
| 30 | 2 | (—CH$_2$)$_2$(—OCH$_2$CH$_2$)$_2$— | H | 5.47 | 1 635 | 406 | 43 |

Table 5

Compounds of the general formula I
n = 2; $R_1$ = (—CH$_2$)$_2$—O—(CH$_2$—)$_2$

| Compound No. | | NMR vinyl protons $\delta$(ppm) (CDCl$_3$) | IR (cm$^{-1}$) (CH$_2$Cl$_2$) | MS (M$^+$) | Yield (% of th.) |
|---|---|---|---|---|---|
| 31 | H$_3$C, H$_5$C$_6$ / C=C \ O—, H | 6.32 / 6.04 | 1 645 | 338 | 54 |
| 32 | H$_5$C$_6$, H$_5$C$_6$ / C=C \ O—, H | 6.41 | 1 625 | 462 | 60 |
| 33 | (fluorenylidene) =C \ O—, H | — | 1 650 | 458 | 23 |

General Rule C

Preparation of Compounds 34 to 36 listed in Table 6

1 mole of a monovalent aliphatic alcohol is added to 1 mole of methyl enol ether or ethyl enol ether in the presence of 1% by weight of an acid catalyst, for example, potassium hydrogen sulfate, and the mixture is stirred for one hour at room temperature. After 0.5% by weight of 85% phosphoric acid and 1.2% by weight of pyridine have been added to the mixed acetal or ketal which has been formed as an intermediate product, the mixture is heated to the boiling point.

The readily volatile alcohol which is slowly formed in the reaction is removed under vacuum. Upon termination of the separation of alcohol, the content of the flask is distilled. The enol ether yields are not optimized. For characterization, the signals of the vinylic protons in the NMR spectrum, the enol ether bands in the IR Table 6

Compounds of the general formula I
n = 1; $R_1$ = (—CH$_2$)$_2$(—OCH$_2$CH$_2$)$_2$—O—C$_4$H$_9$

| Compound No. | $R_2$ | $R_3$ | $R_4$ | NMR vinyl protons $\delta$(ppm) (CDCl$_3$) | IR (cm$^{-1}$) (CH$_2$Cl$_2$) | MS (M$^+$) | Yield (% of th.) |
|---|---|---|---|---|---|---|---|
| 34 | H | (—CH$_2$)$_4$— | | 4.65 | 1 660 | 286 | 39 |
| 35 | ethyl | propyl | H | 4.33 | 1 660 | 302 | 39 |
| 36 | H | methyl | phenyl | 5.65 / 5.42 | 1 645 | 322 | 37 | spectrum and the mole peaks in the mass spectrum are given.

EXAMPLE 1

An offset printing form is prepared as follows:
A coating solution composed of:
94.6 p.b.w. of methyl ethyl ketone,
4.0 p.b.w. of a cresol-formaldehyde novolak (melting range according to the capillary method DIN 53 181: 105° to 120° C.),
1.2 p.b.w. of compound 30,
0.2 p.b.w. of 2-(4,7-dimethoxy-naphth-1-yl)-4,6-bis-trichloromethyl-s-triazine, and
0.01 p.b.w. of Crystal Violet
is applied to an electrolytically roughened and anodized aluminum foil on a whirler coater (150 rpm), so that a dry coating weight of about 1.5 to 2.0 g/m$^2$ is obtained. The sufficiently dried light-sensitive material is exposed for 20 seconds under a positive line and halftone original using a 5 kW metal halide lamp disposed at a distance of 110 cm; upon exposure a strong blue-green image contrast is visible.

For development the following developing solution is used:
5.5% of sodium metasilicate × 5 H$_2$O,
3.4% of trisodium phosphate × 12 H$_2$O,
0.4% of sodium dihydrogen phosphate, anhydrous, and
97.7% of completely desalinated water.

The exposed layer areas are removed within 40 seconds, and the blue-dyed unexposed layer areas remain as the printing stencil. The offset printing form thus prepared is, as usual, dyed with a greasy ink and clamped into a printing machine. For storing, the plate wise irradiated over all spectral lines using an argon ion laser having a luminous efficiency of 10 or 25 W, the laser beam being focused on a spot having a diameter of 5 μm. The sensitivities of the layers are determined by may be wiped over with commercial preserving agents. The printing test is interrupted after the production of 50,000 prints, with the printing form still being intact. The long press run obtainable still may be markedly increased by post-heating the developed printing form to about 230° to 240° C.

A similar result is obtained if compound 30 is replaced by the same quantity by weight of compound 28.

EXAMPLES 2 and 3

Wire-brushed aluminum foils are coated with about 2 μm thick layers having the following composition:
74% of the novolak of Example 1,
22% of compound 29,
3.8% of an acid donor, and
0.2% of Crystal Violet.

The printing plates obtained are irradiated with 11 kV electrons. The plates are then dipped into the developer specified in Example 1, whereby the irradiated areas are dissolved under the conditions mentioned in Table 7.

Table 7

| Example | Acid Donor | Irradiated Energy (Joule/cm$^2$) | Developing Time (s) |
|---|---|---|---|
| 2 | 2-(4-ethoxy-napth-1-yl)-4,6-bis-trichloro-methyl-s-triazine | 5–50 · 10$^{-2}$ | 60 |
| 3 | chlorinated paraffin resin | 8–150 · 10$^2$ | 30 |

The layer of Example 3 is practically insensitive to irradiation by the light sources normally used in the art.

EXAMPLE 4

The following example shows the stability under thermal load of the layers containing the acid-cleavable enol ethers of the invention:

A brushed aluminum foil is whirler-coated with a coating solution according to Example 1, in such a way that the dried layer has a thickness of about 1.5 μm.

The material thus obtained is heated for 1 hour to 100° C. in a drying cabinet, and is then exposed for 15 seconds under the conditions given in Example 1, and developed within 2 minutes by rising in the developer of Example 1, so that a positive reproduction of the original is formed which is suitable for use as an offset printing form.

If a phenol-formaldehyde novolak having a melting range of 110° to 120° C. according to DIN 53 181 is employed instead of the novolak mentioned in Example 1, the developing time is reduced. If electrolytically roughened and anodized aluminum is used as a support material, the developing time is increased to 3 minutes.

EXAMPLE 5

Aluminum plates are whirler-coated with solutions of the following composition:
4.7 p.b.w. of the novolak of Example 1,
1.4 p.b.w. of compound 29,
0.23 p.b.w. of an acid donor and
0.02 p.b.w. of Crystal Violet base in
93.65 p.b.w. of butane-2-one,
so that, after drying, coating layers having thicknesses of about 1.7 μm are obtained. These layers are image-varying the luminous efficiency and the writing speed of the laser. The exposed layer areas may be dissolved by treating the plates with the developer of Example 1, and the trace of the laser is further accentuated by dyeing the non-irradiated areas with a greasy ink.

Table 8

| Efficiency of the Laser | Acid Donor | Aluminum Surface | Development (s) | Maximum Writing Speed (m/s) |
|---|---|---|---|---|
| 25 W | 2-(4-ethoxy-naphth-1-yl)-4,6-bis-trichloro-methyl-s-triazine | wire-brushed | 70 | 60 |
| 25 W | 2-(4-ethoxy-naphth-1-yl)-4,6-bis-trichloro-methyl-s-triazine | electrolytically roughened and anodized | 60 | 100 |
| 10 W | 2,5-diethoxy-4-p-tolyl-mercapto-benzene-diazonium-hexafluorophosphate | electrolytically roughened and anodized | 35 | 100 |
| 10 W | 2,5-diethoxy-4-p-tolyl-mercapto-benzene-diazonium-hexafluorophosphate | wire-brushed | 35 | 100 |

A similar result is obtained, if the diazonium salt mentioned is replaced by the same quantity by weight of 2,5-diethoxy-4-benzoylamino-benzene-diazonium-hexafluorophosphate.

EXAMPLE 6

Brushed aluminum plates are dip-coated in solutions having the following composition:
10.64 p.b.w. of the novolak of Example 1,
3.20 p.b.w. of an enol ether and
0.16 p.b.w. of 2-(4-(2-ethoxy-ethoxy)-naphth-1-yl)-4,6-bis-trichloromethyl-s-triazine in
86.00 p.b.w. of methyl ethyl ketone.

After the plates have been removed from the coating solutions and the solvent has been allowed to evaporate, the plates are dried for 20 seconds in a stream of warm air and are then exposed through a line original which is covered by a 1 mm thick glass plate. The exposing apparatus is equipped with four 40 W fluorescent tubes spaced 4 cm apart. The distance between the periphery of the tubes and the plate surface is about 5 cm.

The exposure times required for the various enol ethers are given in Table 9. Development into a positive reproduction of the original is carried out by rinsing in the developer of Example 1.

Table 9

| Compound | Exposure Time (seconds) | Compound | Exposure Time (seconds) |
|---|---|---|---|
| 1 | 10 | 19 | 5 |
| 2 | 11 | 20 | 10 |
| 3 | 8 | 21 | 10 |
| 4 | 3 | 22 | 10 |
| 5 | 4 | 23 | 15 |
| 6 | 20 | 24 | 11 |
| 7 | 8 | 25 | 20 |
| 8 | 13 | 26 | 10 |
| 9 | 13 | 27 | 11 |
| 10 | 30 | 28 | 15 |
| 11 | 2 | 29 | 14 |
| 12 | 10 | 30 | 15 |
| 13 | 15 | 31 | 30 |
| 14 | 4 | 32 | 25 |
| 15 | 10 | 33 | 15 |
| 16 | 10 | 34 | 13 |

Table 9-continued

| Compound | Exposure Time (seconds) | Compound | Exposure Time (seconds) |
| --- | --- | --- | --- |
| 17 | 1 | 35 | 3 |
| 18 | 3 | 36 | 6 |

It will be obvious to those skilled in the art that many modifications may be made within the scope of the present invention without departing from the spirit thereof, and the invention includes all such modifications.

What is claimed is:

1. In a radiation-sensitive mixture containing (a) a compound which forms an acid under the influence of actinic radiation and (b) a compound which has at least one acid-cleavable C—O—C group and the solubility of which in a liquid developer is increased by the action of an acid, the improvement that compound (b) corresponds either to the general formula I

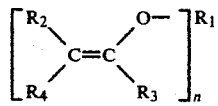

wherein
$R_1$ is an n-valent aliphatic group which has at least 2 carbon atoms,
$R_2$, $R_3$, & $R_4$ are identical or different and are hydrogen atoms, alkyl or aryl groups or any two thereof are linked to form a saturated or olefinically unsaturated ring, and
n is an integer from 1 to 4,
or to the general formula II

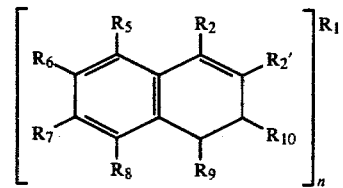

wherein
$R_2$ and $R_2'$ are groups which differ from each other, one of the groups representing the —O-group and the other a hydrogen atom, an alkyl or aryl group,
$R_5$ to $R_{10}$ are identical or different and are hydrogen atoms or halogen atoms, alkyl, aryl or alkoxy groups, and
$R_1$ and n have the meanings stated above.

2. A radiation-sensitive mixture according to claim 1 in which n is 1 or 2.

3. A radiation-sensitive mixture according to claim 1 in which $R_2'$ is —O—.

4. A radiation-sensitive mixture according to claim 1 in which another grouping of the Formula I is present as a substituent in one of the groups $R_2$, $R_3$, and $R_4$.

5. A radiation-sensitive mixture according to claim 1 in which the compound which is capable of being cleft by an acid has a molecular weight in the range between 250 and 800.

6. A radiation-sensitive mixture according to claim 1 which additionally contains a polymeric water-insoluble binder.

7. A radiation-sensitive mixture according to claim 6 in which the water-insoluble binder is a phenol resin.

8. A radiation-sensitive mixture according to claim 1 in which the compound (a) which forms an acid under the influence of actinic radiation is a 2-aryl-4,6-bis-trichloromethyl-s-triazine.

* * * * *

UNITED STATES PATENT AND TRADEMARK OFFICE
CERTIFICATE OF CORRECTION

PATENT NO. : 4,248,957
DATED : February 3, 1981
INVENTOR(S) : Jürgen Sander; Detlef Skaletz; Gerhard Buhr; and Gerhard Lohaus It is certified that error appears in the above—identified patent and that said Letters Patent is hereby corrected as shown below:

Column 15, lines 1 through 4, are to be deleted.

Column 15, line 48, "rising" should read - - - rinsing - - -.

Column 16, the following has been omitted and should be inserted at the beginning of line 1: - - - wise irradiated over all spectral lines using an argon ion laser having a luminous efficiency of 10 or 25 W, the laser beam being focused on a spot having a diameter of 5 $\mu$m. The sensitivities of the layers are determined by - - -.

Signed and Sealed this

Sixteenth Day of June 1981

[SEAL]

Attest:

RENE D. TEGTMEYER

Attesting Officer     Acting Commissioner of Patents and Trademarks